(12) United States Patent
Shin et al.

(10) Patent No.: US 11,064,620 B2
(45) Date of Patent: Jul. 13, 2021

(54) COVER WINDOW FOR DISPLAY DEVICE AND DISPLAY DEVICE INCLUDING THE SAME

(71) Applicant: Samsung Display Co., Ltd., Yongin-si (KR)

(72) Inventors: Heon Jung Shin, Hwaseong-si (KR); Hye-Jin Oh, Asan-si (KR); Jeoung Sub Lee, Seoul (KR); Min-Hoon Choi, Seoul (KR); Bo A Kim, Icheon-si (KR); Sang Hoon Kim, Hwaseong-si (KR); Sang-Il Park, Yongin-si (KR); Hyun Joon Oh, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 148 days.

(21) Appl. No.: 15/431,205

(22) Filed: Feb. 13, 2017

(65) Prior Publication Data

US 2018/0063980 A1 Mar. 1, 2018

(30) Foreign Application Priority Data

Aug. 26, 2016 (KR) .......................... 10-2016-0109218

(51) Int. Cl.
*B32B 7/02* (2019.01)
*H05K 5/03* (2006.01)
(Continued)

(52) U.S. Cl.
CPC ................. *H05K 5/03* (2013.01); *B32B 7/02* (2013.01); *B32B 7/12* (2013.01); *B32B 27/08* (2013.01);
(Continued)

(58) Field of Classification Search
CPC ..... B32B 27/08; B32B 27/281; B32B 27/283; B32B 27/285; B32B 27/306; B32B 27/34;
(Continued)

(56) References Cited

U.S. PATENT DOCUMENTS 5,733,615 A 3/1998 Rackovan et al.
5,846,659 A 12/1998 Lower et al.
(Continued)

FOREIGN PATENT DOCUMENTS

KR 10-2009-0088511 8/2009
KR 10-2010-0060886 6/2010
(Continued)

OTHER PUBLICATIONS

Kapton Summary of Properties, Du Pont, 2017 (Year: 2017).*
(Continued)

*Primary Examiner* — Zachary M Davis
(74) *Attorney, Agent, or Firm* — H.C. Park & Associates, PLC

(57) ABSTRACT

An exemplary embodiment provides a cover window for a display device, including: a first film; a second film disposed on the first film; and an adhesive layer disposed between the first film and the second film, wherein the adhesive layer includes an elastic polymer, and wherein a ratio of a thickness of the second film to a thickness of the first film is in a range of 0.2 to 5.

22 Claims, 3 Drawing Sheets

(51) Int. Cl.
| | |
|---|---|
| *H01L 51/52* | (2006.01) |
| *B32B 27/28* | (2006.01) |
| *G09F 9/30* | (2006.01) |
| *G06F 1/16* | (2006.01) |
| *B32B 7/12* | (2006.01) |
| *B32B 27/08* | (2006.01) |
| *B32B 27/30* | (2006.01) |
| *B32B 27/34* | (2006.01) |
| *B32B 27/40* | (2006.01) |
| *G02F 1/1333* | (2006.01) |

(52) U.S. Cl.
CPC .......... *B32B 27/281* (2013.01); *B32B 27/283* (2013.01); *B32B 27/285* (2013.01); *B32B 27/288* (2013.01); *B32B 27/306* (2013.01); *B32B 27/34* (2013.01); *B32B 27/40* (2013.01); *G06F 1/1652* (2013.01); *G09F 9/301* (2013.01); *H01L 51/5256* (2013.01); *B32B 2250/24* (2013.01); *B32B 2255/10* (2013.01); *B32B 2307/412* (2013.01); *B32B 2307/51* (2013.01); *B32B 2307/536* (2013.01); *B32B 2307/546* (2013.01); *B32B 2307/558* (2013.01); *B32B 2307/732* (2013.01); *B32B 2457/20* (2013.01); *G02F 1/133305* (2013.01); *G02F 2201/50* (2013.01); *G02F 2202/28* (2013.01); *H01L 2251/5338* (2013.01); *H01L 2251/558* (2013.01)

(58) Field of Classification Search
CPC ...... B32B 27/40; H05K 5/03; C09J 123/0861; C09J 175/00; C09J 175/04; C09J 175/06; C09J 175/08; C09J 175/10; C09J 175/12; C09J 175/14; C09J 175/16; C09J 183/04; C09J 183/06
See application file for complete search history.

(56) References Cited

U.S. PATENT DOCUMENTS

| | | | |
|---|---|---|---|
| 5,880,800 | A | 3/1999 | Mikura et al. |
| 2002/0034155 | A1 | 3/2002 | Usami |
| 2007/0009741 | A1 | 1/2007 | Boven et al. |
| 2008/0034155 | A1 | 2/2008 | Koga et al. |
| 2011/0250375 | A1 | 10/2011 | Bries et al. |
| 2013/0034685 | A1 | 2/2013 | An et al. |
| 2014/0030496 | A1 | 1/2014 | Oh et al. |
| 2014/0349064 | A1 | 11/2014 | Han et al. |
| 2015/0010742 | A1 | 1/2015 | Han et al. |
| 2015/0029648 | A1 | 1/2015 | Kim |
| 2015/0086763 | A1* | 3/2015 | Nam .................... H01L 51/524 428/212 |
| 2015/0147532 | A1* | 5/2015 | Nam .................... G02B 26/005 428/172 |
| 2015/0268697 | A1 | 9/2015 | Nam et al. |
| 2015/0301248 | A1 | 10/2015 | Izaki et al. |
| 2016/0101593 | A1 | 4/2016 | Nam et al. |
| 2016/0297178 | A1* | 10/2016 | Kang .................... B32B 27/06 |
| 2018/0258332 | A1* | 9/2018 | Song .................... C09J 183/04 |

FOREIGN PATENT DOCUMENTS

| | | |
|---|---|---|
| KR | 10-2011-0061027 | 6/2011 |
| KR | 10-2014-0013785 | 2/2014 |
| KR | 10-2014-0139299 | 12/2014 |
| KR | 10-2015-0004496 | 1/2015 |
| KR | 10-2015-0012877 | 2/2015 |
| KR | 10-2015-0054291 | 5/2015 |
| KR | 10-2016-0042360 | 4/2016 |
| WO | 2014/168423 | 10/2014 |

OTHER PUBLICATIONS

Ultem 1000 Technical Data Sheet, Sabic, 2019 (Year: 2019).*
Extended European Search Report dated Nov. 13, 2017, issued in European Patent Application No. 17169387.2.
Cambridge University Engineering Department, "Materials Data Book 2003 Edition", Jan. 1, 2003, pp. 1-41.
Office Action dated Jun. 25, 2020, in European Patent Application No. 17169387.2.
Verker et al., "Erosion of POSS-polyimide films under hypervelocity impact and atomic oxygen: The role of mechanical properties at elevated temperatures," Acta Materialia, Nov. 27, 2008, pp. 1112-1119; vol. 57, Issue 4, Elsevier Ltd., Oxford, GB.

* cited by examiner

COVER WINDOW FOR DISPLAY DEVICE AND DISPLAY DEVICE INCLUDING THE SAME

CROSS-REFERENCE TO RELATED APPLICATION

This application claims priority from and the benefit of Korean Patent Application No. 10-2016-0109218, filed on Aug. 26, 2016, which is hereby incorporated by reference for all purposes as if fully set forth herein.

BACKGROUND

Field

Exemplary embodiments relate to a cover window for a display device and a display device including the same.

Discussion of the Background

Various mobile electronic apparatuses with a liquid crystal display device or an organic light emitting diode display device, such as a portable phone, a navigation device, a digital camera, an electronic book, a portable game console, have recently been developed. A display device for a mobile electronic apparatus has a cover window to protect the display panel of the display device from external impact. However, it is difficult to develop a cover window with enough strength to protect a display panel from external impact while being sufficiently flexible for use in a flexible display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a cover window for a display device, and a display device including the same, having advantages of being foldable and having surface hardness that is equal to or greater than a threshold level.

Additional aspects will be set forth in the detailed description which follows, and, in part, will be apparent from the disclosure, or may be learned by practice of the inventive concept.

An exemplary embodiment provides a cover window for a display device, including a first film, a second film disposed on the first film, and an adhesive layer disposed between the first film and the second film. The adhesive layer includes an elastomer and a ratio of a thickness of the second film to a thickness of the first film is in a range of 0.2 to 5.

An exemplary embodiment provides a cover window for a display device, including: a first film; a second film disposed on the first film; and an adhesive layer disposed between the first film and the second film to include an elastomer, wherein at least one of the first film and the second film includes a material having a ratio of modulus to yield stress that is in a range of 30 to 70, resilience that is in a range of 50 newton millimeter divided by millimeter$^3$ (N·m/m$^3$) to 150 N·m/m$^3$ and toughness that is in a range of 200 N·m/m$^3$ to 1500 N·m/m$^3$.

An exemplary embodiment provides a display device including a display panel, a cover window disposed on the display panel, and a coating layer disposed on the cover window, wherein the cover window includes a first film adjacent to the display panel, a second film adjacent to the coating layer, and an adhesive layer disposed between the first film and the second film, wherein the adhesive layer includes an elastomer, and wherein a ratio of a thickness of the second film to a thickness of the first film is in a range of 0.2 to 5.

An exemplary embodiment provides a display device including a display panel, a cover window disposed on the display panel, and a coating layer disposed on the cover window, wherein the cover window includes a first film configured to be adjacent to the display panel, a second film configured to be adjacent to the coating layer, and an adhesive layer disposed between the first film and the second film to include an elastomer, and at least one of the first film and the second film includes a material having a ratio of modulus to yield stress that is in a range of 30 to 70, resilience that is in a range of 50 N·m/m$^3$ to 150 N·m/m$^3$ and toughness that is in a range of 200 N·m/m$^3$ to 1500 N·m/m$^3$.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
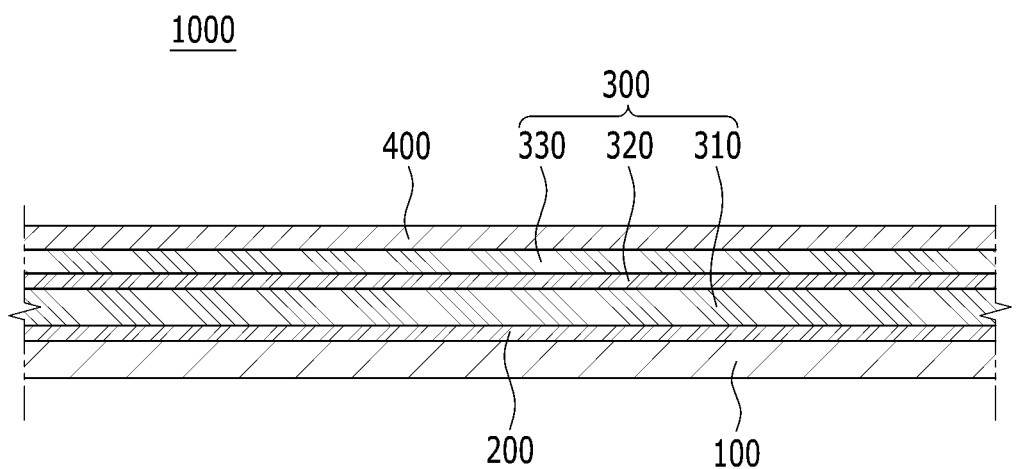
FIG. 1 is a cross-sectional view illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Generally, in a display device used in a mobile apparatus, a transparent cover window is disposed on a front side of a display panel so that a user can see a display. Since the cover window is formed at an outermost side of the device, the cover window should be resistant to external impact in order to protect the display panel and the apparatus internals.

Recently, manufacturers have integrated a touch panel with a display panel to be used as an input device for various mobile electronic apparatuses. Using a touch panel typically means that a surface of the cover window for the display device often comes into contact with a finger or stylus of a user. The repeated contact and impact of a finger or stylus requires a cover window with higher strength.

Moreover, scientists and engineers are exploring flexible display devices, which require or preferably include a flexible or foldable cover window applied to this display device. However, increasing the flexibility of a cover window reduces its strength and the strength of the display device. Similarly, increasing the strength of a cover window increased the rigidity of the cover window (i.e., decreases the flexibility). Thus, it is difficult to develop a cover window that is simultaneously strong and flexible or strong and foldable.

According to the exemplary embodiments described below, a cover window for a display device and a display device including the same may be foldable and having surface hardness that is equal to or greater than a threshold level.

First, a display device according to an exemplary embodiment will be described with reference to FIG. 1 and FIG. 2.

FIG. 1 is a cross-sectional view illustrating a display device according to an exemplary embodiment. FIG. 2 is a cross-sectional view illustrating a display device according to an exemplary embodiment.

As shown in FIG. 1, the display device 1000 according to the exemplary embodiment includes a display panel 100, a cover window 300 disposed on the display panel 100, an adhesive layer 200 disposed between the display panel 100 and the cover window 300, and a coating layer 400 disposed on the cover window 300.

The display panel 100 may be flexible, stretchable, foldable, bendable, or rollable.

The display panel 100 may be formed as an organic light emitting diode display panel. The display panel 100 may include a substrate, a plurality of thin film transistors, and a plurality of electrodes disposed on the substrate, and the like. Since the substrate may be flexible, stretchable, foldable, bendable, or rollable, the display panel 100 may be flexible, stretchable, foldable, bendable, or rollable.

Although the display panel 100 has been described above to be formed as an organic light emitting diode display panel, the present invention is not limited thereto. According to another exemplary embodiment, the display panel 100 may be formed as a liquid crystal panel, an electrophoretic display panel, an electrowetting display panel, or the like.

An optical layer may be disposed on the display panel 100. Further, the optical layer may be mounted within the display panel 100. The optical layer may include a phase delay layer, a polarization layer, and the like.

The adhesive layer 200 may include an optical clear adhesive (OCA), an optical clear resin (OCR), a pressure sensitive adhesive (PSA), or the like. The adhesive layer 200 disposed between the display panel 100 and the cover window 300 may serve to adhere the display panel 100 and the cover window 300 to each other.

The cover window 300 disposed on the display panel 100 to be adhered to the display panel 100 by the adhesive layer 200 may serve to protect the display panel 100 against external interference. The cover window 300 may include a first film 310, a second film 330, and an adhesive layer 320 disposed between the first film 310 and the second film 330.

The first film 310 may be disposed on the display panel 100 close to the display panel 100. In other words, a distance between the second film 330 and the display panel 100 may be greater than a distance between the first film 310 and the display panel 100.

The second film 330 may be disposed on the first film 310 close to the coating layer 400. In other words, a distance between the first film 310 and the coating layer 400 may be greater than a distance between the second film 330 and the coating layer 400.

For example, a thickness of the first film 310 is in a range of about 5 μm to about 60 μm, and a thickness of the second film 330 is in a range of about 5 μm to about 60 μm. A sum of the thicknesses of the first film 310 and the second film 330 may be in a range of about 30 μm to about 100 μm. The thickness of the first film 310 may be greater than that of the second film 330.

The first film 310 and the second film 330 may be formed of a same material or different materials. Each of the first film 310 and the second film 330 may include at least one of polyimide (PI), polyamide-imide (PAI), polyetheretherketone (PEEK), and polyetherimide (PEI).

The adhesive layer 320 disposed between the first film 310 and the second film 330 may serve to adhere the first film 310 and the second film 330 to each other. The adhesive layer 320 may be made of an elastomer having a modulus that is lower than those of the first film 310 and the second film 330. A stress generated when the display device 1000 is bent or folded may be reduced by the action of the adhesive layer 320, thereby improving a folding characteristic of the display device 1000. Further, since the adhesive layer 320 has high resilience, the hardness may be improved through a repulsion and restoration characteristic thereof.

The adhesive layer 320 may be formed in a film-like shape that may be adhered using a thermal or compressing process using ethylene vinyl acetate (EVA), polydimethylsiloxane (PDMS), polyurethane (PU), or the like. However, the adhesive layer 320 is not limited thereto. For example, the adhesive layer 320 may be made of an optical clear resin or an optical clear adhesive such as urethane, acryl, and a silicon-based material. The adhesive layer 320 may be formed of a single material or two or more kinds of materials.

The adhesive layer 320 may have a thickness that is in a range of about 5 μm to about 50 μm.

The coating layer 400 may be coated on a surface of the second film 330, and may be formed as a functional coating layer. The coating layer 400 may serve as at least one of a hard coating layer, an anti-fingerprint coating (AF) layer, an anti-reflection coating (AR) layer, and an anti-glare coating (AG) layer.

Hereinafter, a bent state of a display device according to an exemplary embodiment will be described with reference to FIG. 2.

Figure 2:
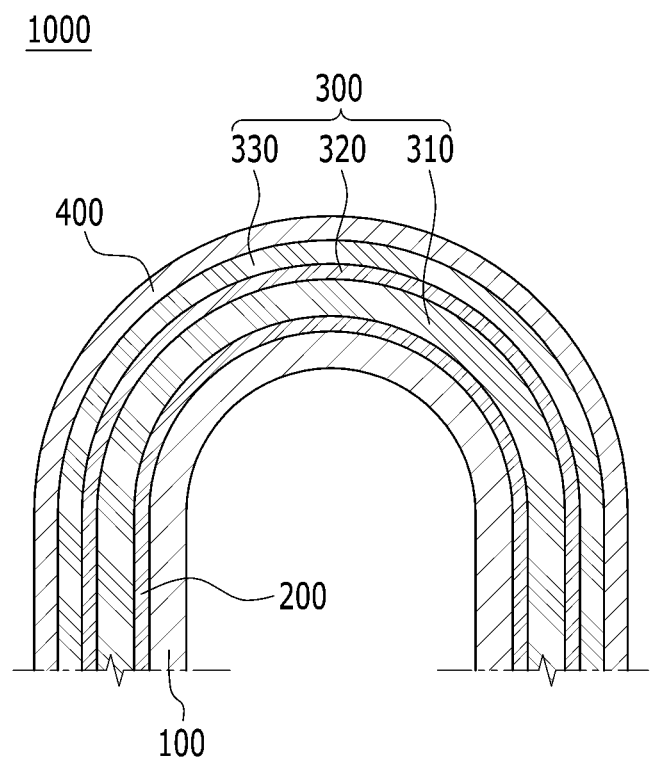
FIG. 2 is a cross-sectional view illustrating a display device according to an exemplary embodiment.

As shown in FIG. 2, in the display device 1000 according to the present exemplary embodiment, when the display panel 100 is bent, the cover window 300 is also bent along a bent shape of the display panel 100.

When the cover window 300 is formed of a single film, the cover window 300 that is thinly formed may lead to a reduction in the hardness, while the cover window 300 that is thickly formed may lead to deterioration of a folding characteristic thereof. In the present exemplary embodiment, the cover window 300 includes the first film 310 and the second film 330, and the adhesive layer 320 formed of an elastomer is disposed between the first film 310 and the second film 330. Accordingly, it is possible to simultaneously improve not only the hardness but also the folding characteristic. The adhesive layer 320 formed of the elastomer may reduce the stress generated when the cover window 300 is bent, thereby improving the folding characteristic. Further, when a high load is applied, the hardness may be improved by the repulsive and restoring characteristic of the adhesive layer 320.

Next, a display device according to an exemplary embodiment will be described with reference to FIG. 3.

Figure 3:
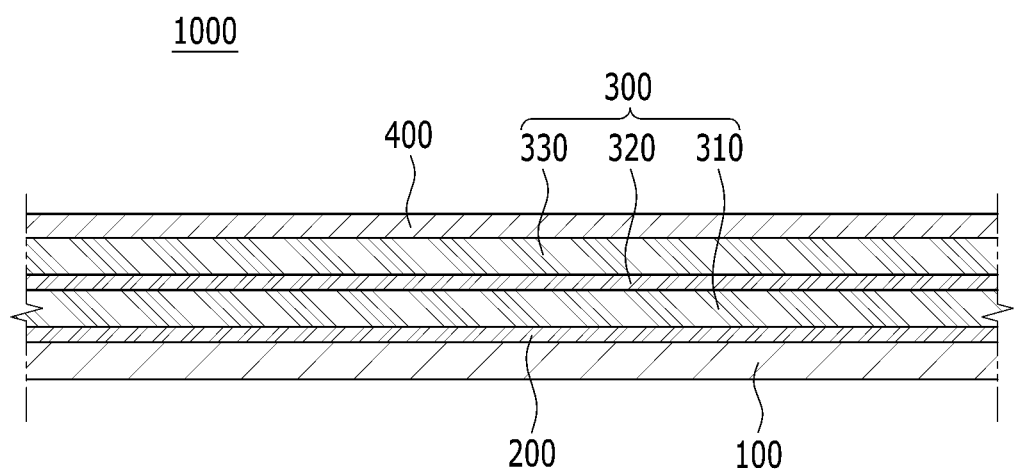
FIG. 3 is a cross-sectional view illustrating a display device according to an exemplary embodiment.

Since the display device according to the exemplary embodiment of FIG. 3 is substantially the same as that of FIG. 1 and FIG. 2, redundant description will be omitted. The present exemplary embodiment may be different from the exemplary embodiment of FIGS. 1 and 2 in the thicknesses of the first film and the second film.

FIG. 3 is a cross-sectional view illustrating a display device according to an exemplary embodiment.

As in the exemplary embodiment of FIGS. 1 and 2, the display device 1000 according to the exemplary embodiment includes a display panel 100, a cover window 300, and a coating layer 400. The cover window 300 may include a first film 310, a second film 330, and an adhesive layer 320 disposed between the first film 310 and the second film 330.

In the exemplary embodiment of FIGS. 1 and 2, a thickness of the first film 310 is greater than that of the second film 330. However, in the present exemplary embodiment, the first film 310 and the second film 330 may have the same thickness. In this case, this means that the thickness of the first film 310 is substantially the same as that of the second film 330, and the thicknesses of the first film 310 and the second film 330 may be slightly different from each other within an error range. The first film 310 and the second film 330 may be formed of a same material or different materials.

Next, a display device according to an exemplary embodiment will be described with reference to FIG. 4.

Figure 4:
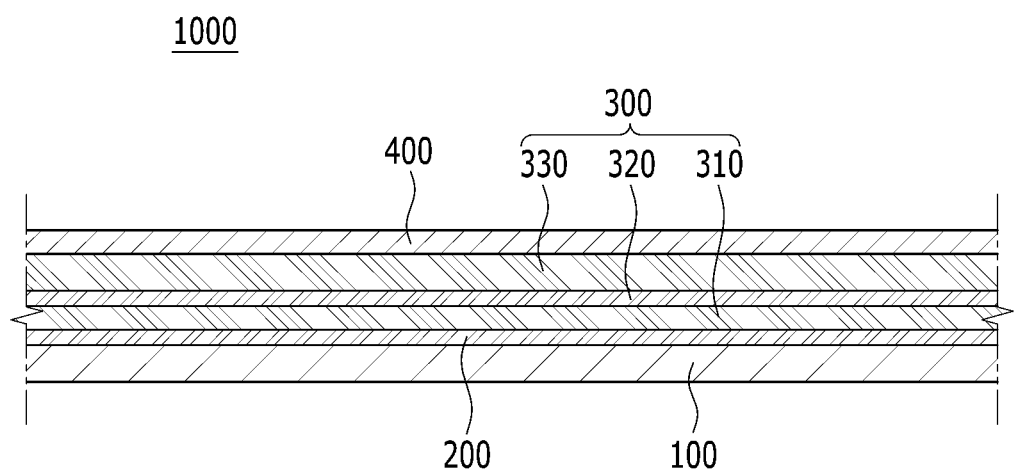
FIG. 4 is a cross-sectional view illustrating a display device according to an exemplary embodiment.

Since the display device according to the exemplary embodiment of FIG. 4 is substantially the same as that of FIG. 1 and FIG. 2, redundant description will be omitted. The present exemplary embodiment may be different from the exemplary embodiment of FIGS. 1 and 2 in the thicknesses of the first film and the second film.

FIG. 4 is a cross-sectional view illustrating a display device according to an exemplary embodiment.

As in the exemplary embodiment of FIGS. 1 and 2, the display device 1000 according to the exemplary embodiment includes a display panel 100, a cover window 300, and a coating layer 400. The cover window 300 includes a first film 310, a second film 330, and an adhesive layer 320 disposed between the first film 310 and the second film 330.

In the exemplary embodiment of FIGS. 1 and 2, a thickness of the first film 310 is greater than that of the second film 330. However, in the present exemplary embodiment of FIG. 4, the thickness of the second film 330 may be greater than that of the first film 310. Specifically, in the exemplary embodiment of FIGS. 1 and 2, the thickness of the first film 310 which is adjacent to the display panel 100 is relatively thicker, while in the present exemplary embodiment, the thickness of the second film 330 which is adjacent to the coating layer 400 is relatively thicker. The first film 310 and the second film 330 may be formed of a same material or different materials.

As explained in the above exemplary embodiments, the thicknesses of the first film 310 and the second film 330 constituting the cover window 300 may be substantially the same or different from each other. In this case, the first film 310 may be relatively thicker, or the second film 330 may be relatively thicker. Hereinafter, a folding characteristic and hardness depending on a thickness ratio between the first film 310 and the second film 330 will be described with reference Table 1.

TABLE 1

| | | Thickness ratio between first film and second film | Folding number (Times) | Pencil hardness |
|---|---|---|---|---|
| Examples | A | 1:5 | 300,000 or more | H |
| | B | 2:3 | 300,000 or more | H |
| | C | 1:1 | 300,000 or more | 2H |
| | D | 3:2 | 300,000 or more | 3H |
| | E | 5:1 | 220,000 | 3H |
| Comparative | F | 1:8 | 140,000 | 3B |
| Examples | G | 10:1 | 25,000 | 5H |

In Example A in which the thickness ratio between the first film 310 and the second film 330 was set to about 1:5, although a bending test of the display device was performed about 300,000 or more times to check the folding characteristic, no damage was generated in the cover window. The test was not continued since the folding characteristic was considered to be sufficient in the case of 300,000 or more folds. In this case, Example A may have hardness close to pencil hardness H for the display device. When the hardness of the cover window was separately measured, Example A had hardness close to pencil hardness 9H or more. Table 1 indicates hardness of the entire display device.

In Example B in which the thickness ratio between the first film 310 and the second film 330 was set to about 2:3, i.e., about 1:1.5, the folding number was set to 300,000 or more, similar to Example A. As a result, Example B has hardness close to pencil hardness H.

In Example C in which the thickness ratio between the first film 310 and the second film 330 was set to about 1:1, i.e., in which the thicknesses of the two films are substantially the same, the folding number was set to 300,000 or more, similar to Example A. Example C may have hardness close to pencil hardness 2H. In other words, Example C may have hardness that is higher than those of Example A and Example B.

In Example D in which the thickness ratio between the first film 310 and the second film 330 was set to about 3:2, i.e., about 1:0.67, the folding number was set to 300,000 or more, similar to Example A. As a result, Example B has hardness close to pencil hardness 3H. In other words, Example D may have hardness that is higher than those of Example A, Example B, and Example C.

In Example E in which the thickness ratio between the first film 310 and the second film 330 was set to about 5:1, i.e., 1:0.2, the folding number was about 220,000. As a result, Example E has hardness close to pencil hardness 3H or more, similar to Example D.

In Comparative Example F in which the thickness ratio between the first film 310 and the second film 330 was set to about 1:8, the folding number was about 140,000. As a result, Comparative Example F has hardness close to pencil hardness 3B.

In Comparative Example G in which the thickness ratio between the first film 310 and the second film 330 was set to about 10:1, i.e., 1:0.1, the folding number was about 25,000. As a result, Comparative Example G has hardness close to pencil hardness 5H.

Example A, Example B, Example C, Example D, and Example E have strong folding characteristics and high hardness as compared with Comparative Example F and Comparative Example G. From the tests, it is shown that the folding characteristic and the hardness are affected by the ratio of the thickness of the second film 330 to the thickness of the first film 310. The display device in which the ratio of the thickness of the second film 330 to the thickness of the first film 310 is in a range of about 0.2 to about 5 has a folding number of about 220,000 or more. Accordingly, it is shown that the folding characteristic may be improved compared to the comparative examples. Further, it is shown that the display device in which the ratio of the thickness of the second film 330 to the thickness of the first film 310 is in a range of about 0.2 to about 5 has high hardness of pencil hardness H or higher. It is seen that Comparative Example F has a low folding characteristic and low hardness as compared with the examples. It is also seen that Comparative Example G has a low folding characteristic as compared with the examples. Accordingly, the ratio of the thickness of the second film 330 to the thickness of the first film 310 may be set in a range of about 0.2 to about 5 (e.g., 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, or 5.0) in order to simultaneously improve the folding characteristic and the hardness.

Particularly, when the folding characteristic is prioritized, the thickness ratio between the first film 310 and the second film 330 may be set as in Example A, Example B, Example C, and Example D, indicating the folding number of about 300,000 or more. In other words, when the ratio of the thickness of the second film 330 to the thickness of the first film 310 is set in a range of about 0.67 to about 5, a stronger folding characteristic may be obtained.

Further, when the hardness is prioritized, the thickness ratio of the first film 310 and the second film 330 may be set as in Example C, Example D, and Example E, indicating the pencil hardness of 2H or more. In other words, when the ratio of the thickness of the second film 330 to the thickness of the first film 310 is set in a range of about 0.2 to about 1, a higher hardness may be obtained.

In addition, when the folding characteristic and the hardness are simultaneously prioritized, the thickness ratio of the first film 310 and the second film 330 may be set as in Example C and Example D, indicating the folding number of about 300,000 or more and a hardness of 2H or more. In other words, when the ratio of the thickness of the second film 330 to the thickness of the first film 310 is set in a range of about 0.67 to about 1 (e.g., 0.67, 0.68, 0.69, 0.70, 0.71, 0.72, 0.73, 0.74, 0.75, 0.76, 0.77, 0.78, 0.79, 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 0.98, 0.99, or 1.0), stronger folding characteristic and higher hardness may be obtained.

In the above, the folding characteristic and the hardness of the display device depending on the thickness ratio between the first film 310 and the second film 330 have been described. The folding characteristic and the hardness of the display device may be affected by the material characteristics of the first film 310 and the second film 330. Folding characteristic and hardness depending on a ratio of yield stress of materials of the first film 310 and the second film 330, and modulus, resilience, and toughness, will be described with reference to Table 2.

When a small stress is applied to an object, the object may be deformed (elastically deformed) in proportion to the stress. When the stress is removed, the object may return to its original state. However, when the stress exceeds a critical level, the deformation may be increased. This is referred to as yielding, and the critical stress is referred to as a yield stress of the material.

The modulus indicates a deformation level generated when an elastic material is stressed.

The resilience is an amount of elastic energy that is accumulated as elastic energy, which disappears when an external force is removed.

The toughness is a measure of how tough a material is, including a degree of how non-fragile it is, a degree of how strong it is, and a degree of how difficult it is to cause breakage.

TABLE 2

| | | Ratio between yield stress and modulus | Resilience (N·m/m$^3$) | Toughness (N·m/m$^3$) | Folding number (Times) | Pencil hardness |
|---|---|---|---|---|---|---|
| Example | H | 1:56 | 84 | 602 | 240,000 or more | H |
| | I | 1:54 | 108 | 1197 | 200,000 | F |
| Comparative Example | J | 1:51 | 43 | 1238 | 130,000 | 4B |
| | K | 1:172 | 12 | 17 | 18,000 | 6B |
| | L | 1:43 | 176 | 7710 | 150,000 | 6B or less |

In Example H in which the ratio between yield stress and modulus of the first film 310 and the second film 330 was set to 1:56, and a material having resilience of about 84 N·m/m$^3$ and toughness of 602 N·m/m$^3$ was used, the folding number was about 240,000 or more, and hardness of about pencil hardness H was obtained.

In Example I in which the ratio between yield stress and modulus of the first film 310 and the second film 330 was set to 1:54, and a material having resilience of about 108 N·m/m$^3$ and toughness of 1197 N·m/m$^3$ was used, the folding number was about 200,000 or more, and hardness of about pencil hardness F was obtained.

In Comparative Example J in which the ratio between yield stress and modulus of the first film 310 and the second film 330 was set to 1:51, and a material having resilience of about 43 N·m/m$^3$ and toughness of 1238 N·m/m$^3$ was used, the folding number was about 130,000 or more, and hardness of about pencil hardness 4B was obtained. Comparative Example J is similar to Example H and Example I in the ratio between yield stress and modulus, and is different therefrom in the resilience and the toughness. In this case, the folding characteristic and the hardness of Comparative Example J is deteriorated as compared with Example H and Example I.

In Comparative Example K in which the ratio between yield stress and modulus of the first film 310 and the second film 330 was set to 1:172, and a material having a resilience of about 12 N·m/m$^3$ and a toughness of 17 N·m/m$^3$ was used, the folding number was about 18,000 or more, and hardness of about pencil hardness 6B was obtained. In the case of Comparative Example K, the ratio of modulus to yield stress is increased, but the resilience and the toughness are reduced as compared with Example H and Example I. In this case, the folding characteristic and the hardness of Comparative Example K are deteriorated as compared with Example H and Example I.

In Comparative Example L in which the ratio between yield stress and modulus of the first film 310 and the second film 330 was set to 1:43, a material having resilience of about 176 N·m/m$^3$ and toughness of 7710 N·m/m$^3$ was used, the folding number was set to about 150,000 or more, and hardness of about pencil hardness 6B or less was obtained. Comparative Example L is similar to Example H and Example I in the ratio between yield stress and modulus, and is different therefrom in the resilience and the toughness. In this case, the folding characteristic and the hardness of Comparative Example L are deteriorated as compared with Example H and Example I.

As such, the ratio between yield stress and modulus, the resilience, and the toughness have complex effects on the folding characteristic and the hardness of the display device. In other words, when at least one of the ratio between yield stress and modulus, the resilience, and the toughness is not in an appropriate range, the folding characteristic and the hardness may deteriorate. Accordingly, appropriate ranges of the ratio between yield stress and modulus, the resilience, and the toughness are described as follows.

When at least one of the first film 310 and the second film 330 has a ratio of modulus to yield stress that is in a range of about 30 to about 70 (e.g., 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70) and includes a material having resilience that is in a range of about 50 N·m/m$^3$ to about 150 N·m/m$^3$ (e.g., 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, or 150 N·m/m$^3$), and toughness that is in a range of about 200 N·m/m$^3$ to about 1500 N·m/m$^3$ (e.g., 200, 250, 300, 350, 400, 450, 500, 550, 600, 650, 700, 750, 800, 850, 900, 950, 1000, 1050, 1150, 1200, 1250, 1300, 1350, 1400, 1450, or 1500 N·m/m$^3$), the folding characteristic and the hardness may be improved. In other words, one of the first film 310 and the second film 330 may be formed of a material that satisfies the appropriate ranges, or both of the first film 310 and the second film 330 may be formed of materials that satisfy the appropriate ranges.

Next, a display device according to an exemplary embodiment will be described with reference to FIG. 5.

Figure 5:
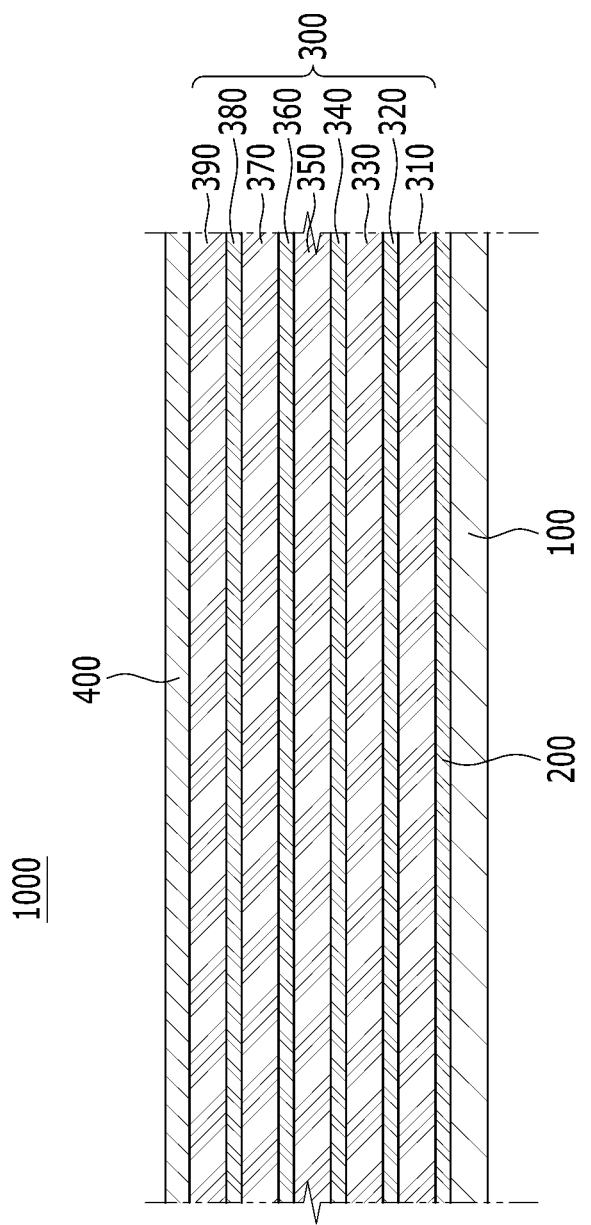
FIG. 5 is a cross-sectional view illustrating a display device according to an exemplary embodiment.

Since the display device according to the exemplary embodiment of FIG. 5 is substantially the same as that of FIG. 1 and FIG. 2, redundant description will be omitted. The present exemplary embodiment is different from the exemplary embodiment of FIGS. 1 and 2 in that the cover window may include 5 films.

FIG. 5 is a cross-sectional view illustrating a display device according to an exemplary embodiment.

As in the exemplary embodiment of FIGS. 1 and 2, the display device 1000 according to the exemplary embodiment includes a display panel 100, a cover window 300, and a coating layer 400.

The cover window 300 may include a first film 310, a second film 330, a third film 350, a fourth film 370, and a fifth film 390. In the exemplary embodiment of FIGS. 1 and 2, the cover window 300 includes two films, while in the present exemplary embodiment of FIG. 5, the cover window 300 includes five films. The present exemplary embodiment is not limited thereto. For example, the cover window 300 may include three or four films, or six or more films.

An adhesive layer 320 may be disposed between the first film 310 and the second film 330, an adhesive layer 340 may be disposed between the second film 330 and the third film 350, an adhesive layer 360 may be disposed between the third film 350 and the fourth film 370, and an adhesive layer 380 may be disposed between the fourth film 370 and the fifth film 390. Each of the adhesive layers 320, 340, 360, and 380 may be formed of an elastomer.

In the cover window 300, the first film 310 may have a highest modulus, a modulus of the second film 330 may be lower than that of the first film 310, a modulus of the third film 350 may be lower than that of the second film 330, a modulus of the fourth film 370 may be lower than that of the third film 350, and a modulus of the fifth film 390 may be lower than that of the fourth film 370. As a result, as a distance from the display panel 100 is increased, the modulus of the cover window 300 may be gradually reduced.

The present invention is not limited thereto. For example, the first film 310 may have a lowest modulus, a modulus of the second film 330 may be higher than that of the first film 310, a modulus of the third film 350 may be higher than that of the second film 330, a modulus of the fourth film 370 may be higher than that of the third film 350, and a modulus of the fifth film 390 may be higher than that of the fourth film 370. As a result, as a distance from the display panel 100 is increased, the modulus of the cover window 300 may be gradually increased.

The present invention is not limited thereto. For example, the moduli of the first film 310, the second film 330, the third film 350, the fourth film 370, and the fifth film 390 may be variously adjusted.

Each thickness of the first film 310, the second film 330, the third film 350, the fourth film 370, and the fifth film 390 may be in a range of about 5 µm to about 60 µm, and the first film 310, the second film 330, the third film 350, the fourth film 370, and the fifth film 390 may be formed to have a same thickness or different thicknesses.

The first film 310 and the second film 330 may be formed of a same material or different materials. Each of the first film 310, the second film 330, the third film 350, the fourth film 370, and the fifth film 390 may include at least one of polyimide (PI), polyamide-imide (PAI), polyetheretherketone (PEEK), and polyetherimide (PEI).

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A cover window for a display device configured to bend in a bending area, the cover window comprising:
    a first film having a first thickness in the bending area and outside the bending area;
    a second film disposed on the first film, the second film having a second thickness different from the first film; and
    a film-based adhesive layer disposed between the first film and the second film,
    wherein the film-based adhesive layer comprises an elastomer,
    wherein a ratio of the second thickness to the first thickness is greater than or equal to 0.2 and less than 1.0, and
    wherein at least one of the first film and the second film comprises a material having a ratio of modulus to yield stress that is in a range of 30 to 70, a resilience that is in a range of 50 N·m/m$^3$ to 150 N·m/m$^3$, and a toughness that is in a range of 200 N·m/m$^3$ to 1500 N·m/m$^3$.

2. The cover window of claim 1, wherein:
    the cover window consists of the first film, the second film, and the film-based adhesive; and
    a total thickness of the cover window is in a range of 35 µm to 150 µm.

3. The cover window of claim 1, wherein the ratio of the second thickness to the first thickness is greater than or equal to 0.67 and less than or equal to 1.0.

4. The cover window of claim 1, wherein:
    a sum of the thickness of the first film and the thickness of the second film is in a range of 30 µm to 100 µm; and
    each of the thicknesses of the first film and the second film is in a range of 5 µm to 60 µm.

5. The cover window of claim 1, wherein a thickness of the film-based adhesive layer is in a range of 5 µm to 50 µm.

6. The cover window of claim 1, wherein each of the first film and the second film comprises at least one of polyimide (PI), polyamide-imide (PAI), polyetheretherketone (PEEK), and polyetherimide (PEI).

7. The cover window of claim 1, wherein the film-based adhesive layer comprises at least one of ethylene vinyl acetate (EVA), polydimethylsiloxane (PDMS), and polyurethane (PU).

8. The cover window of claim 1, wherein the film-based adhesive is at least one of a thermally activated and a compression-activated film-based adhesive.

9. A cover window for a display device, comprising:
    a first film;
    a second film disposed on the first film; and
    an adhesive layer comprising an elastomer, the adhesive layer being disposed between the first film and the second film,
    wherein at least one of the first film and the second film comprises a material having a ratio of modulus to yield stress that is in a range of 30 to 70, a resilience that is in a range of 50 N·m/m$^3$ to 150 N·m/m$^3$, and a toughness that is in a range of 200 N·m/m$^3$ to 1500 N·m/m$^3$.

10. The cover window of claim 9, wherein each of the first film and the second film comprises at least one of polyimide (PI), polyamide-imide (PAI), polyetheretherketone (PEEK), and polyetherimide (PEI).

11. The cover window of claim 9, wherein the adhesive layer comprises at least one of ethylene vinyl acetate (EVA), polydimethylsiloxane (PDMS), polyurethane (PU), urethane, acryl, and a silicon-based material.

12. A display device, comprising:
    a display panel;
    a cover window disposed on the display panel; and
    a coating layer disposed on the cover window,
    wherein the cover window is configured to bend in a bending area, the cover window comprising:
        a first film more adjacent to the display panel than the coating layer, a thickness of the first film outside the bending area being equivalent to a thickness of the first film inside the bending area;
        a second film more adjacent to the coating layer than the display panel, a thickness of the second film outside the bending area being equivalent to a thickness of the second film inside the bending area, the thickness of the second film being different from the thickness of the first film; and
        a film-based adhesive layer disposed between the first film and the second film,
    wherein the film-based adhesive layer comprises an elastomer, wherein a ratio of the thickness of the second film to the thickness of the first film is in a range of 0.2 to 5, but excludes 1.0, and wherein at least one of the first film and the second film comprises a material having a ratio of modulus to yield stress that is in a range of 30 to 70, a resilience that is in a range of 50 N·m/m$^3$ to 150 N·m/m$^3$, and a toughness that is in a range of 200 N·m/m$^3$ to 1500 N·m/m$^3$.

13. The display device of claim 12, wherein the ratio of the thickness of the second film to the thickness of the first film is in a range of 0.67 to 5, but excludes 1.0.

14. The display device of claim 12, wherein the ratio of the thickness of the second film to the thickness of the first film is greater than or equal to 0.2 and less than 1.0.

15. The display device of claim 12, wherein the ratio of the thickness of the second film to the thickness of the first film is greater than or equal to 0.67 and less than 1.0.

16. The display device of claim 12, wherein:
a sum of the thickness of the first film and the thickness of the second film is in a range of 30 μm to 100 μm; and
each of the thicknesses of the first film and the second film is in a range of 5 μm to 60 μm.

17. The display device of claim 12, wherein a thickness of the film-based adhesive layer is in a range of 5 μm to 50 μm.

18. The display device of claim 12, wherein each of the first film and the second film comprises at least one of polyimide (PI), polyamide-imide (PAI), polyetheretherketone (PEEK), and polyetherimide (PEI).

19. The display device of claim 12, wherein the film-based adhesive layer comprises at least one of ethylene vinyl acetate (EVA), polydimethylsiloxane (PDMS), and polyurethane (PU).

20. A display device, comprising:
a display panel;
a cover window disposed on the display panel; and
a coating layer disposed on the cover window,
wherein the cover window comprises:
a first film adjacent to the display panel;
a second film adjacent to the coating layer; and
an adhesive layer comprising an elastomer, the adhesive layer being disposed between the first film and the second film, and
wherein at least one of the first film and the second film comprises a material having a ratio of modulus to yield stress that is in a range of 30 to 70, a resilience that is in a range of 50 N·m/m$^3$ to 150 N·m/m$^3$, and a toughness that is in a range of 200 N·m/m$^3$ to 1500 N·m/m$^3$.

21. The display device of claim 20, wherein each of the first film and the second film comprises at least one of polyimide (PI), polyamide-imide (PAI), polyetheretherketone (PEEK), and polyetherimide (PEI).

22. The display device of claim 20, wherein the adhesive layer comprises at least one of ethylene vinyl acetate (EVA), polydimethylsiloxane (PDMS), polyurethane (PU), urethane, acryl, and a silicon-based material.

* * * * *